United States Patent
Matsuda et al.

(10) Patent No.: US 10,763,822 B2
(45) Date of Patent: Sep. 1, 2020

(54) ACOUSTIC WAVE RESONATOR, FILTER, AND MULTIPLEXER

(71) Applicant: TAIYO YUDEN CO., LTD., Tokyo (JP)

(72) Inventors: Takashi Matsuda, Tokyo (JP); Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 38 days.

(21) Appl. No.: 16/175,235

(22) Filed: Oct. 30, 2018

(65) Prior Publication Data

US 2019/0222195 A1 Jul. 18, 2019

(30) Foreign Application Priority Data

Jan. 12, 2018 (JP) ................................. 2018-003614

(51) Int. Cl.
*H03H 9/145* (2006.01)
*H03H 9/25* (2006.01)
(Continued)

(52) U.S. Cl.
CPC ...... *H03H 9/1457* (2013.01); *H03H 9/02559* (2013.01); *H03H 9/02637* (2013.01);
(Continued)

(58) Field of Classification Search
CPC ............. H03H 9/1457; H03H 9/14532; H03H 9/02992; H03H 9/6489; H03H 9/6483;
(Continued)

(56) References Cited

U.S. PATENT DOCUMENTS 7,576,471 B1 * 8/2009 Solal .................. H03H 9/02858
310/313 B
8,063,718 B2 * 11/2011 Ueda ........................ H03H 7/42
333/126
(Continued)

FOREIGN PATENT DOCUMENTS

JP  H 02-127809 A  5/1990
JP  2000-183681 A  6/2000
(Continued)

*Primary Examiner* — Robert J Pascal
*Assistant Examiner* — Jorge L Salazar, Jr.
(74) *Attorney, Agent, or Firm* — Stein IP, LLC

(57) ABSTRACT

An acoustic wave resonator includes: a piezoelectric substrate; and an IDT that is located on the piezoelectric substrate and includes comb-shaped electrodes facing each other, each of the comb-shaped electrodes having grating electrode and a bus bar connected to the grating electrodes, a duty ratio of grating electrodes of the comb-shaped electrodes in a center region of an overlap region differing from a duty ratio of grating electrodes of the comb-shaped electrodes in an edge region of the overlap region in an arrangement direction of the grating electrodes, the grating electrodes of each of the comb-shaped electrodes overlapping with the grating electrodes of the other in the overlap region, a grating electrode of a first one of the comb-shaped electrodes in the center region having a different width from a grating electrode of a second one of the comb-shaped electrodes in the center region.

19 Claims, 11 Drawing Sheets

(51) Int. Cl.
    *H03H 9/64*     (2006.01)
    *H03H 9/02*     (2006.01)
    *H03H 9/72*     (2006.01)

(52) U.S. Cl.
    CPC .... *H03H 9/02818* (2013.01); *H03H 9/02992* (2013.01); *H03H 9/14532* (2013.01); *H03H 9/25* (2013.01); *H03H 9/6483* (2013.01); *H03H 9/6489* (2013.01); *H03H 9/725* (2013.01)

(58) Field of Classification Search
    CPC ...... H03H 9/25; H03H 9/725; H03H 9/02818; H03H 9/02637; H03H 9/02559; H03H 9/64; H03H 9/14544
    USPC .......................................... 333/133, 193–196
    See application file for complete search history.

(56) References Cited

U.S. PATENT DOCUMENTS

| | | |
|---|---|---|
| 2004/0124953 A1 | 7/2004 | Nakatani et al. ............. 333/193 |
| 2011/0068655 A1 | 3/2011 | Solal et al. ............... 310/313 B |
| 2016/0065176 A1 | 3/2016 | Taniguchi et al. |
| 2017/0093367 A1 | 3/2017 | Mimura |
| 2017/0170808 A1 | 6/2017 | Iwaki et al. ......................... 9/25 |
| 2017/0222619 A1 | 8/2017 | Iwamoto et al. |
| 2017/0264262 A1 | 9/2017 | Nakazawa et al. |
| 2017/0366167 A1 | 12/2017 | Nakagawa et al. ................. 9/64 |

FOREIGN PATENT DOCUMENTS

| | | |
|---|---|---|
| JP | 2004-146861 A | 5/2004 |
| JP | 2011-101350 A | 5/2011 |
| JP | 2017-112603 A | 6/2017 |
| JP | 2017-163481 A | 9/2017 |
| WO | WO 2014/192755 A1 | 12/2014 |
| WO | WO 2016/084526 A1 | 6/2016 |

* cited by examiner

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2018-003614, filed on Jan. 12, 2018, the entire contents of which are incorporated herein by reference.

FIELD

A certain aspect of the present invention relates to an acoustic wave resonator, a filter, and a multiplexer.

BACKGROUND

In high frequency communication systems typified by mobile phones, high-frequency filters are used to remove unnecessary signals other than signals in the frequency band used for communication. Acoustic wave resonators such as surface acoustic wave (SAW) resonators are used in the high-frequency filters. In the surface acoustic wave resonator, an Interdigital Transducer (IDT) having a pair of comb-shaped electrodes is formed on a piezoelectric substrate such as a lithium tantalate ($LiTaO_3$) substrate or a lithium niobate ($LiNbO_3$) substrate.

In the acoustic wave resonator, desired input and output impedance can be set by setting the electrostatic capacitance between a pair of comb-shaped electrodes as disclosed in, for example, Japanese Patent Application Publication No. 2004-146861 (hereinafter, referred to as Patent Document 1). The electrostatic capacitance of the pair of comb-shaped electrodes can be set by changing the aperture length and the number of pairs. It has been known to reduce spurious by making the acoustic velocity of the acoustic wave in the edge region of the overlap region of the pair of comb-shaped electrodes lower than the acoustic velocity of the acoustic wave in the center region of the overlap region as disclosed in, for example, Japanese Patent Application Publication Nos. 2011-101350 and 2017-112603 (hereinafter, referred to as Patent Documents 2 and 3, respectively).

SUMMARY OF THE INVENTION

According to a first aspect of the present invention, there is provided an acoustic wave resonator including: a piezoelectric substrate; and an IDT that is located on the piezoelectric substrate and includes a pair of comb-shaped electrodes facing each other, each of the pair of comb-shaped electrodes having grating electrodes, which excite an acoustic wave, and a bus bar connected to the grating electrodes, a duty ratio of grating electrodes of the pair of comb-shaped electrodes in a center region of an overlap region differing from a duty ratio of grating electrodes of the pair of comb-shaped electrodes in an edge region of the overlap region in at least a part of a region of the IDT in a direction in which the grating electrodes are arranged, the grating electrodes of each of the pair of comb-shaped electrodes overlapping with the grating electrodes of the other in the overlap region, a width of a grating electrode of a first comb-shaped electrode of the pair of comb-shaped electrodes in the center region differing from a width of a grating electrode of a second comb-shaped electrode of the pair of comb-shaped electrodes in the center region.

According to a second aspect of the present invention, there is provided a filter including the above acoustic wave resonator.

According to a third aspect of the present invention, there is provided a multiplexer including the above filter.

DETAILED DESCRIPTION

It may be considered to increase the duty ratio of the IDT to reduce the area of the IDT without changing the input and output impedance of the acoustic wave resonator. However, when the duty ratio in the edge region is made to be greater than the duty ratio in the center region to make the acoustic velocity of the acoustic wave in the edge region lower than the acoustic velocity of the acoustic wave in the center region, the duty ratio in the center region is not increased. Thus, the reduction in area of the IDT is difficult.

Description for an Acoustic Wave Resonator

Figure 1A:
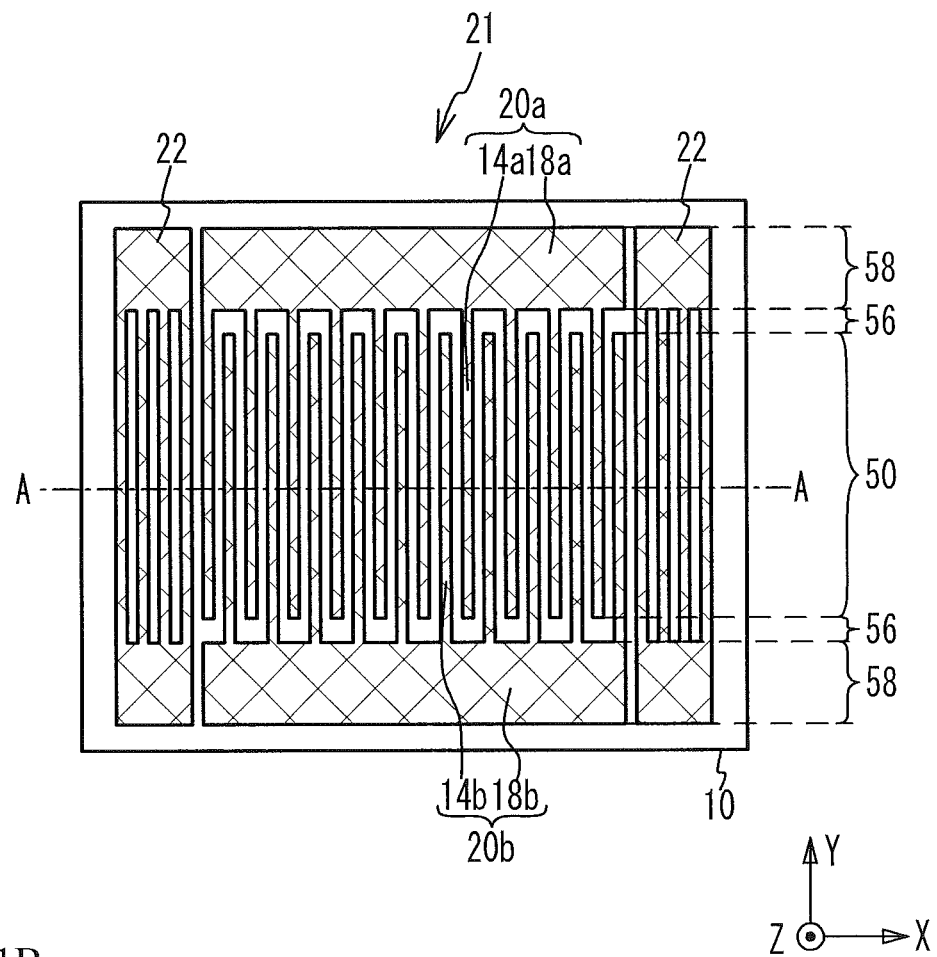
FIG. 1A is a plan view of an acoustic wave resonator.
Figure 1B:
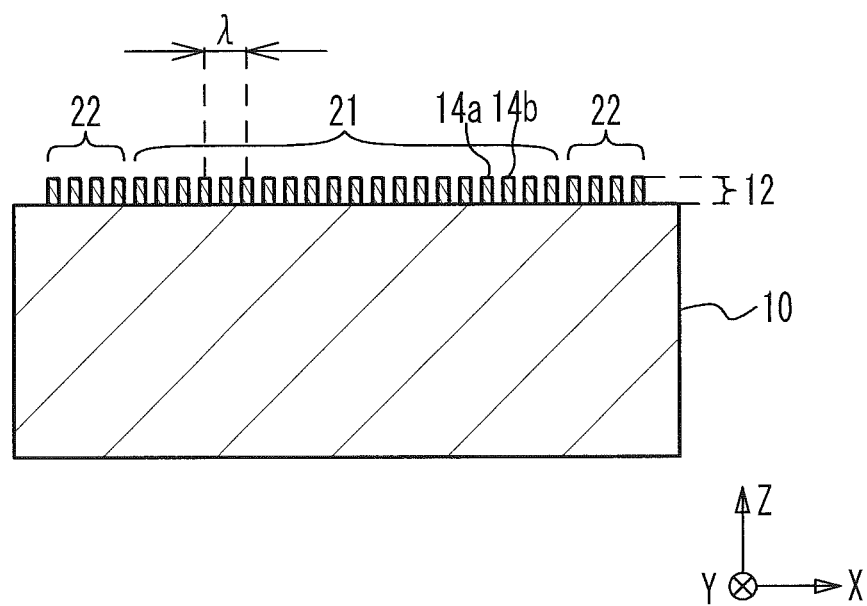
FIG. 1B is a cross-sectional view taken along line A-A in FIG. 1A.

FIG. 1A is a plan view of an acoustic wave resonator, and FIG. 1B is a cross-sectional view taken along line A-A in FIG. 1A. As illustrated in FIG. 1A and FIG. 1B, an IDT 21 and reflectors 22 are formed on a piezoelectric substrate 10. The IDT 21 and the reflectors 22 are formed of a metal film 12 formed on the piezoelectric substrate 10. The IDT 21 includes a pair of comb-shaped electrodes 20a and 20b facing each other. The comb-shaped electrode 20a includes grating electrodes 14a (i.e., electrode fingers) and a bus bar 18a to which the grating electrodes 14a are coupled, and the comb-shaped electrode 20b includes grating electrodes 14b (i.e., electrode fingers) and a bus bar 18b to which the grating electrodes 14b are coupled. The pair of comb-shaped electrodes 20a and 20b are arranged so as to face each other so that the grating electrodes 14a and 14b are substantially alternately arranged in at least a part of the IDT 21.

The region where the grating electrodes 14a of the comb-shaped electrode 20a and the grating electrodes 14b of the comb-shaped electrode 20b overlap is an overlap region 50. The acoustic wave excited by the grating electrodes 14a and 14b in the overlap region 50 propagates mainly in the arrangement direction of the grating electrodes 14a and 14b. The pitch A of the grating electrodes 14a or 14b substantially corresponds to the wavelength of the acoustic wave. The region between the grating electrodes 14a and the bus bar 18b and the region between the grating electrodes 14b and the bus bar 18a are gap regions 56. The regions of the bus bars 18a and 18b are bus bar regions 58. The comb-shaped electrodes 20a and 20b may have dummy electrode fingers. The arrangement direction of the grating electrodes 14a and 14b is defined as an X direction, the direction in which the grating electrodes 14a and 14b extend is defined as a Y direction, and the direction normal to the upper surface of the piezoelectric substrate 10 is defined as a Z direction. The X direction, the Y direction, and the Z direction do not necessarily correspond to the X-axis orientation, the Y-axis orientation, and the Z-axis orientation of the crystal orientation of the piezoelectric substrate 10. The piezoelectric substrate 10 is, for example, a lithium tantalate substrate or a lithium niobate substrate. The metal film 12 is, for example, an aluminum film or a copper film.

Description for a Piston Mode

Figure 2:
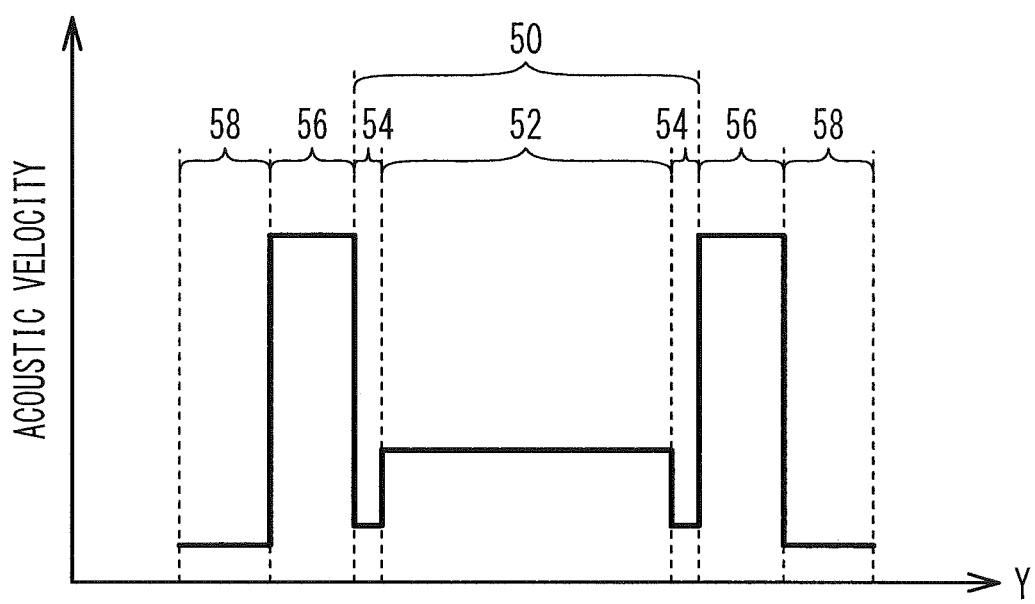
FIG. 2 illustrates the acoustic velocity in a Y direction of the acoustic wave resonator.

A piston mode when an anisotropy coefficient γ is positive will be described. FIG. 2 illustrates the acoustic velocity in the Y direction of the acoustic wave resonator. As illustrated in FIG. 2, the overlap region 50 has a center region 52 located in the middle in the Y direction, and edge regions 54 located at both ends in the Y direction. The acoustic velocity in the gap region 56 is higher than the acoustic velocity in the overlap region 50. Accordingly, the acoustic wave is confined in the overlap region 50. The acoustic velocity in the bus bar region 58 is lower than the acoustic velocity in the overlap region 50. The acoustic velocity in the edge region 54 is lower than the acoustic velocity in the center region 52. Accordingly, the intensity distribution of the basic lateral mode in the overlap region 50 is flat in the Y direction. Furthermore, the coupling coefficient of the high-order lateral mode is small. Therefore, the piston mode that reduces lateral-mode spurious is achieved. When a rotated Y-cut X-propagation lithium niobate substrate is used as the piezoelectric substrate 10, the anisotropy coefficient γ is positive. When a rotated Y-cut X-propagation lithium tantalate substrate is used and the grating electrodes 14a and 14b are made of a heavy material (for example, copper or molybdenum), the anisotropy coefficient γ is positive.

Examples of a method for making the acoustic velocity in the edge region 54 of the acoustic wave low to achieve the piston mode include a method that makes the duty ratios different between the center region 52 and the edge region 54, a method that makes the grating electrode in the edge region 54 thicker than the grating electrode in the center region 52, and a method that provides an additional film in the edge region 54. The method that makes the film thicknesses different between the grating electrodes and the method that provides an additional film increase the number of fabrication steps. Thus, the method that makes the duty ratios of the grating electrodes different between the edge region 54 and the center region 52 is simple.

The electrostatic capacitance and the acoustic velocity were calculated by simulation by changing the duty ratios of the grating electrodes 14a and 14b.

Simulation 1

Figure 3:
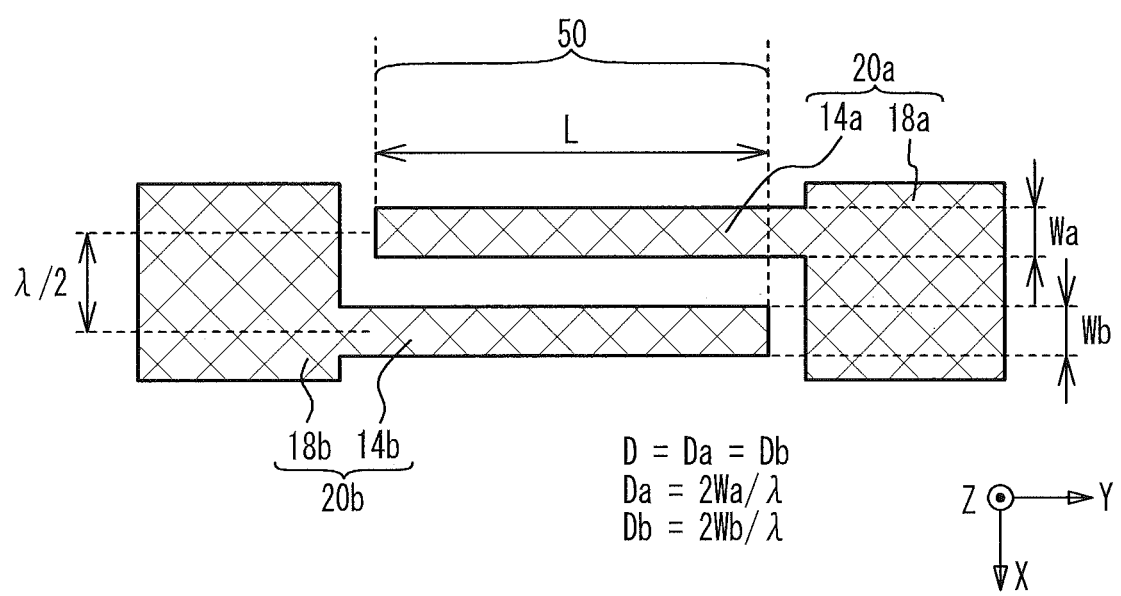
FIG. 3 is a plan view of a pair of grating electrodes used in a simulation 1.

Under the assumption that the acoustic velocity is proportional to the resonant frequency, the resonant frequency obtained by the eigenvalue analysis will be considered. FIG. 3 is a plan view of a pair of grating electrodes used in a simulation 1. As illustrated in FIG. 3, the length of the overlap region 50 corresponds to the aperture length L. In the eigenvalue analysis, the aperture length L does not affect the results. The widths of the grating electrodes 14a and 14b are represented by Wa and Wb, respectively. The pitch of the adjacent grating electrodes 14a and 14b is λ/2. The duty ratio Da of the comb-shaped electrode 20a is 2 Wa/λ, and the duty ratio Db of the comb-shaped electrode 20b is 2 Wb/λ. The duty ratio of the pair of comb-shaped electrodes 20a and 20b is D=Da=Db.

Simulation conditions are as follows.
Piezoelectric substrate 10: 42° rotated Y-cut X-propagation lithium tantalate substrate
Pitch λ: 4.4 μm
Aperture length L: 20λ
Grating electrodes 14a and 14b: Molybdenum film with a film thickness of 0.11λ

Figure 4:
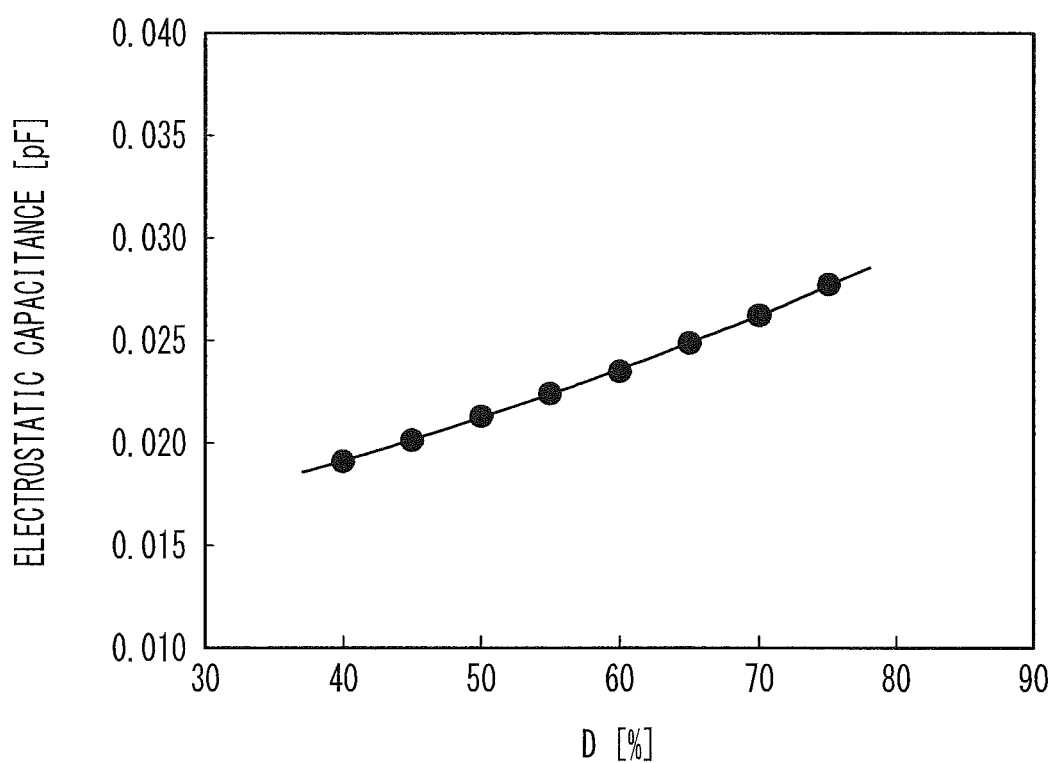
FIG. 4 is a graph of electrostatic capacitance per pair versus a duty ratio D in the simulation 1.

FIG. 4 is a graph of electrostatic capacitance per pair versus the duty ratio D in the simulation 1. The pair includes one grating electrode 14a and one grating electrode 14b. As illustrated in FIG. 4, as the duty ratio D increases, the electrostatic capacitance increases. For example, when the duty ratio D increases from 50% to 65%, the electrostatic capacitance increases 1.17 times. Thus, the area of the acoustic wave resonator having a duty ratio D of 65% is 1/1.17≈0.855 (85.5%) of the area of the acoustic wave resonator having a duty ratio of 50% and the same electrostatic capacitance. As described above, the electrostatic capacitance between the comb-shaped electrodes 20a and 20b is increased by increasing the duty ratio D. Accordingly, the size of the acoustic wave resonator is reduced.

Figure 5:
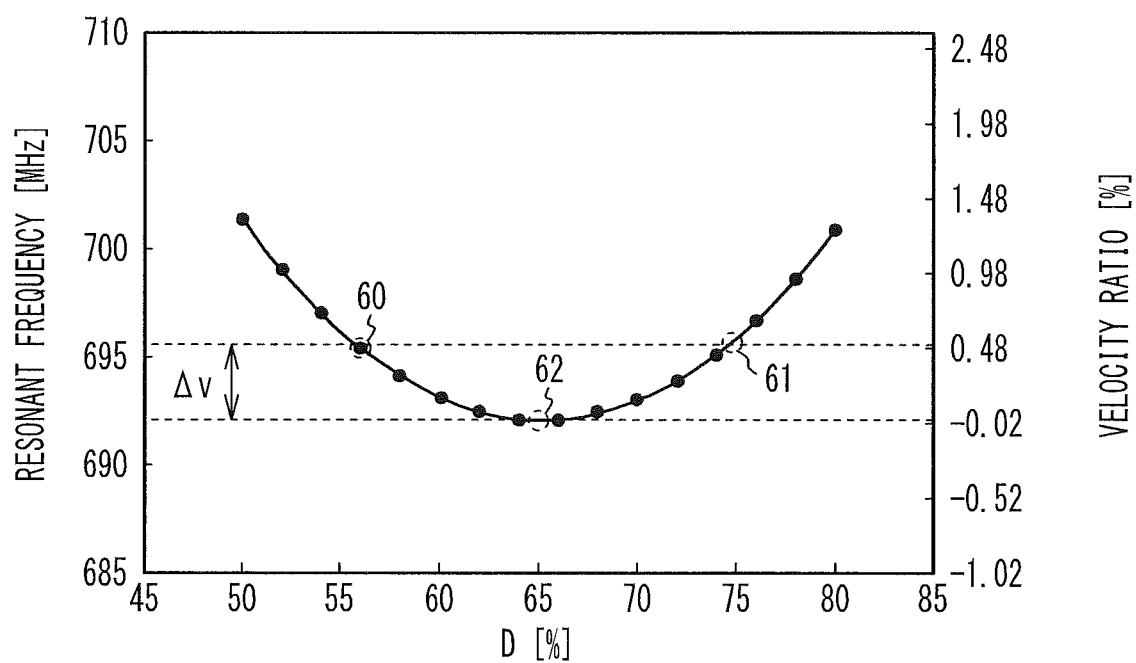
FIG. 5 is a graph of resonant frequency versus the duty ratio D in the simulation 1.

FIG. 5 is a graph of resonant frequency versus the duty ratio D in the simulation 1. As illustrated in FIG. 5, as the duty ratio D is increased beyond 50%, the resonant frequency decreases. As at a point 62, the resonant frequency is minimum when the duty ratio D is 65%. As the duty ratio D is further increased, the resonant frequency increases. The resonant frequency is proportional to the acoustic velocity of the acoustic wave. Thus, the velocity ratio of the acoustic wave with respect to the velocity of the acoustic wave at the resonant frequency at the point 62 is indicated at the right of FIG. 5. The velocity ratio at the point 62 is defined as 0%, and the increase rate of the resonant frequency with respect to the resonant frequency at the point 62 is defined as the velocity ratio [%].

First Comparative Example

In Patent Document 3, as described in paragraph 0083, the acoustic velocity of the acoustic wave in the edge region is made to be lower than the acoustic velocity of the acoustic wave in the center region by 0.5% to achieve the piston mode. Thus, the duty ratio D in the center region 52 is set as 56% at a point 60, and the duty ratio D in the edge region 54 is set as 65% at the point 62. This configuration makes the difference Δv in the velocity ratio of the acoustic wave between the center region 52 and the edge region 54 approximately 0.5%.

Figure 6:
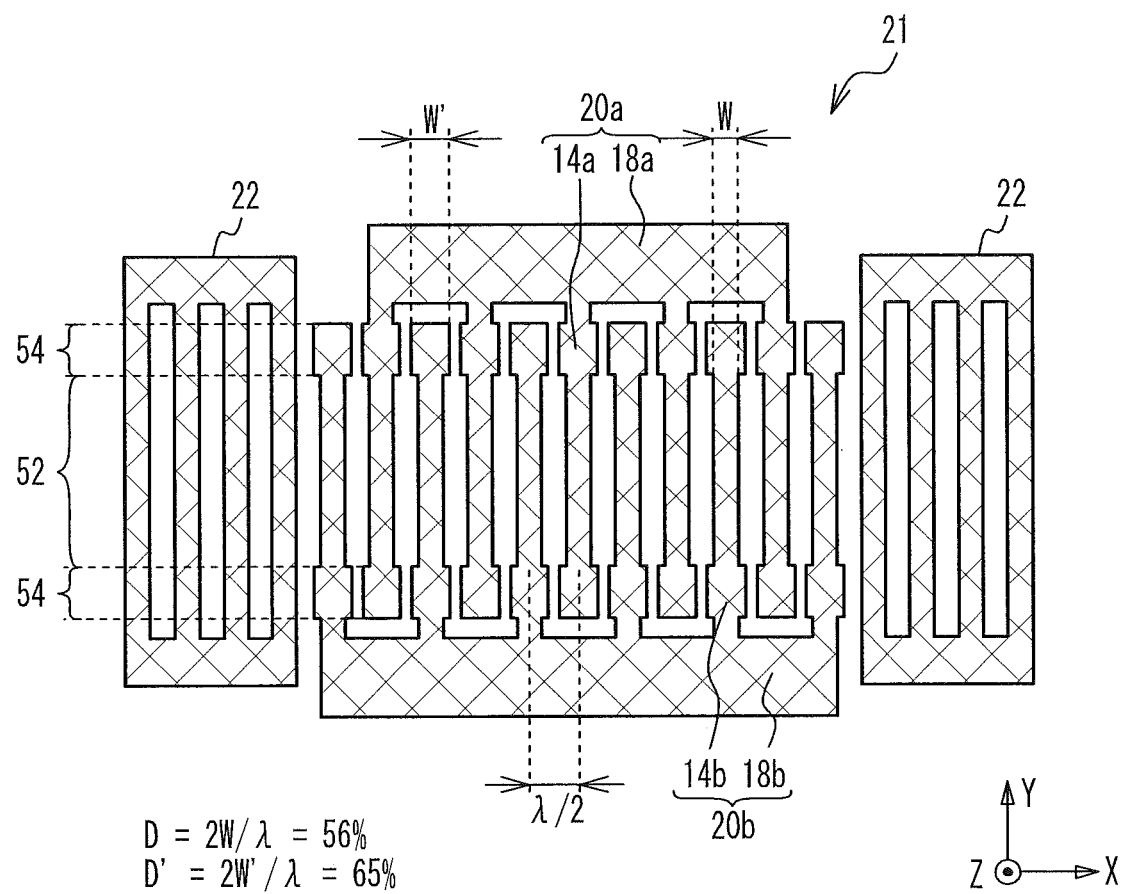
FIG. 6 is a plan view of an acoustic wave resonator in accordance with a first comparative example.

FIG. 6 is a plan view of an acoustic wave resonator in accordance with a first comparative example. As illustrated in FIG. 6, the width W' of each of the grating electrodes 14a and 14b in the edge region 54 is greater than the width W of each of the grating electrodes 14a and 14b in the center region 52. The duty ratio D' in the edge region 54 is 2 W'/λ=65%, and the duty ratio D in the center region 52 is 2 W/λ=56%.

When the length of the edge region 54 is set as 2λ and the length of the center region 52 is set as 16λ, the electrostatic capacitance of the IDT 21 mostly depends on the duty ratio D in the center region 52. Thus, the electrostatic capacitance in the first comparative example is only 1.04 times greater than the electrostatic capacitance when the duty ratio D in the center region 52 is set as 50%. That is, the area of the acoustic wave resonator is reduced only by 1/1.04 times.

Referring to FIG. 5, when the duty ratio D in the center region 52 is set as approximately 75% (the point 61), the acoustic velocity of the acoustic wave in the center region 52 can be made to be the same as the acoustic velocity when the duty ratio D is 56% (the point 60). However, too large duty ratio D makes the interval between the grating electrodes 14a and 14b small. This makes the fabrication difficult.

As described above, when the piston mode is achieved by making the duty ratios different between the edge region 54 and the center region 52, the size reduction of the acoustic wave resonator is difficult. Thus, it was considered to make the duty ratios of the grating electrodes 14a and 14b different between the comb-shaped electrodes 20a and 20b.

Simulation 2

The duty ratio of the comb-shaped electrode 20a was represented by Da, and the duty ratio of the comb-shaped electrode 20b was represented by Db. The duty ratio D of the pair of comb-shaped electrodes 20a and 20b is the average of Da and Db. In a simulation 2, the duty ratio Db was set as 50%, and the duty ratio Da was varied from 50% to 80%.

Figure 7:
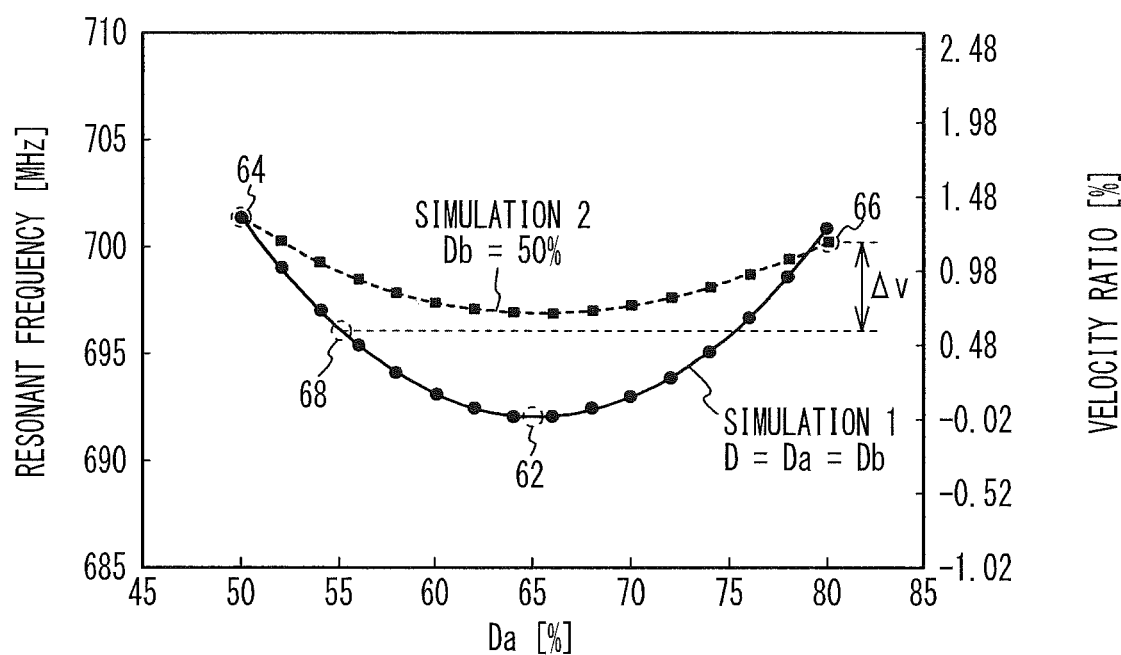
FIG. 7 is a graph of resonant frequency versus a duty ratio Da in a simulation 2.

FIG. 7 is a graph of resonant frequency versus the duty ratio Da in the simulation 2. The solid line indicates the results of the simulation 1 in which D=Da=Db. The dashed line indicates the results of the simulation 2 in which Db=50% and Da was varied. The point at which D=Da=Db=50% in the simulation 1 is defined as a point 64. The point at which D=Da=Db=65% is the point 62. The point at which Da=80% and Db=50% in the simulation 2 is defined as a point 66.

Figure 8A:
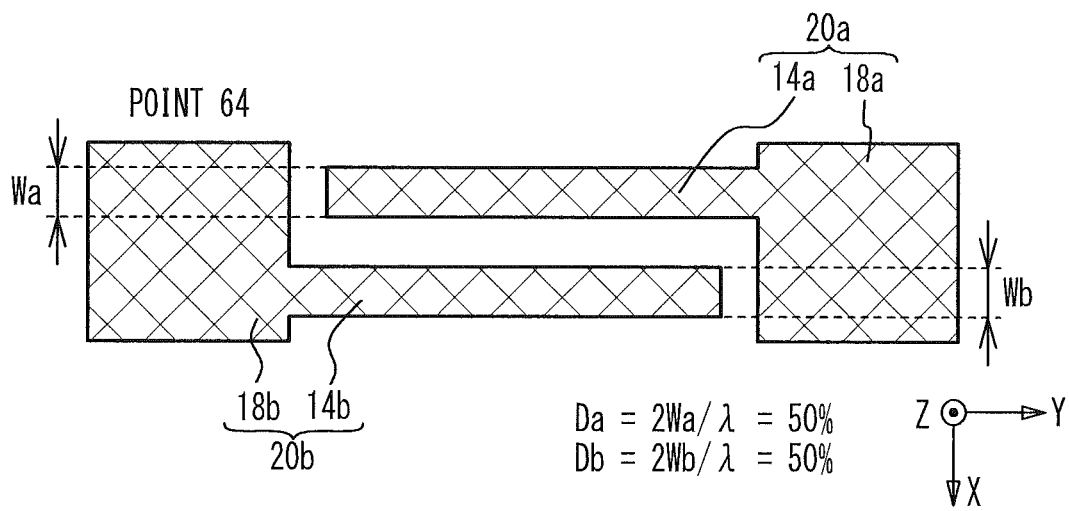
FIG. 8A through FIG. 8C are plan views of respective pairs of grating electrodes at points 64, 62, and 66, respectively.
Figure 8B:
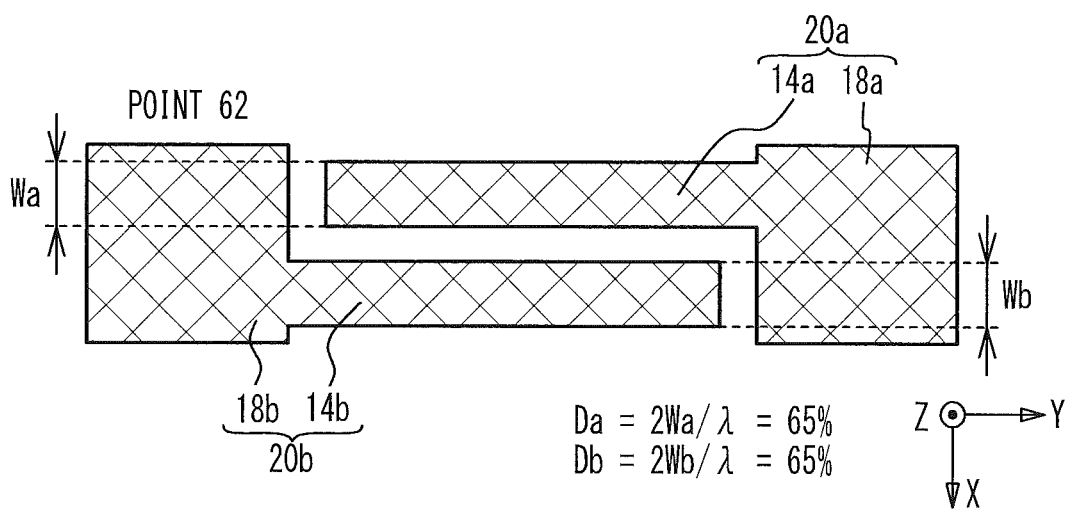
Figure 8C:
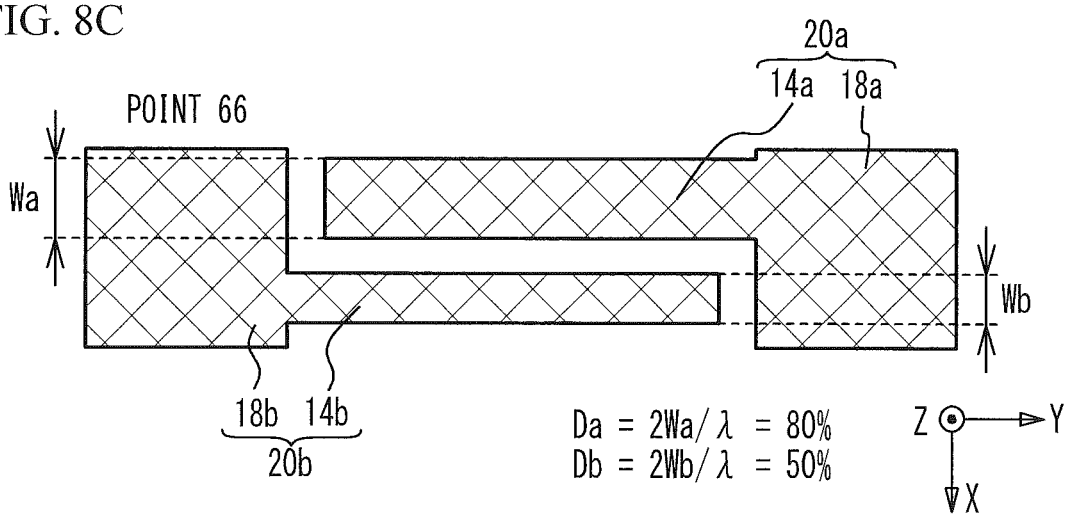

FIG. 8A through FIG. 8C are plan views of respective pairs of grating electrodes at the points 64, 62, and 66, respectively. As illustrated in FIG. 8A, at the point 64, the width Wa of the grating electrode 14a of the comb-shaped electrode 20a is equal to the width Wb of the grating electrode 14b of the comb-shaped electrode 20b. The duty ratio Da of the comb-shaped electrode 20a is 2 Wa/λ=50%, and the duty ratio Db of the comb-shaped electrode 20b is 2 Wb/λ=50%.

As illustrated in FIG. 8B, the widths Wa and Wb at the point 62 are greater than those at the point 64. Both the duty ratios Da and Db are 65%.

As illustrated in FIG. 8C, at the point 66, the width Wa of the grating electrode 14a is greater than the width Wb of the grating electrode 14b. The duty ratio Da of the comb-shaped electrode 20a is 2 Wa/λ=80%, and the duty ratio Db of the comb-shaped electrode 20b is 2 Wb/λ=50%. The duty ratio D of the pair of comb-shaped electrodes 20a and 20b is the average of the duty ratios Da and Db, which is equal to 65% as at the point 62. Thus, the interval between the adjacent grating electrodes 14a and 14b at the point 66 is the same as that at the point 62.

As illustrated in FIG. 7, when the duty ratio Da is 50%, the structures are the same and the resonant frequencies are the same between the simulations 1 and 2. In the simulation 2, the resonant frequency is the smallest when the duty ratio Da is 65%. However, the resonant frequency at this time is higher than the resonant frequency when the duty ratio D is 65% in the simulation 1. The resonant frequency when the duty ratio Da is 80% in the simulation 2 is approximately equal to the resonant frequency when the duty ratio D is 80% in the simulation 1.

First Embodiment

The structure of the grating electrodes 14a and 14b in the edge region 54 is configured to be the structure at the point 68 where the duty ratio D is 54% in the simulation 1 in FIG. 7, and the structure of the grating electrodes 14a and 14b in the center region 52 is configured to be the structure at the point 66 where the duty ratio Da is 80% in the simulation 2. This configuration makes the difference Δv between the velocity ratio of the acoustic wave in the edge region 54 and the velocity ratio of the acoustic wave in the center region 52 approximately 0.5%.

Figure 9A:
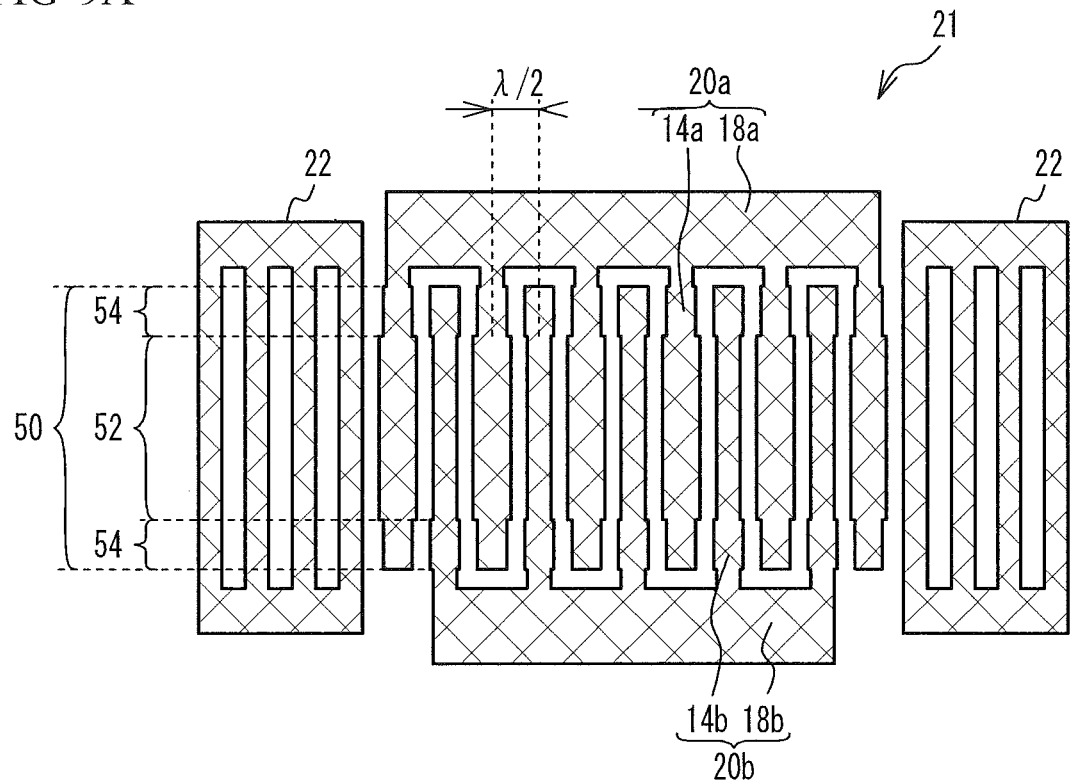
FIG. 9A is a plan view of an acoustic wave resonator in accordance with a first embodiment.
Figure 9B:
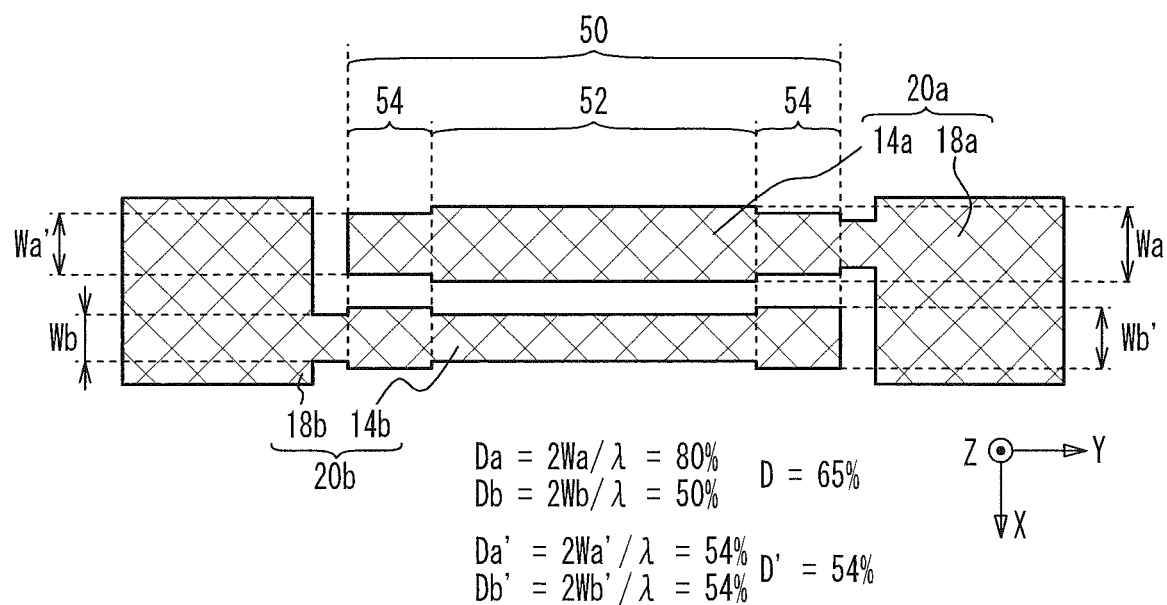
FIG. 9B is a plan view of a pair of grating electrodes.

FIG. 9A is a plan view of an acoustic wave resonator in accordance with a first embodiment, and FIG. 9B is a plan view of a pair of grating electrodes. As illustrated in FIG. 9A and FIG. 9B, the width Wa of the grating electrode 14a in the center region 52 is greater than the width Wb of the grating electrode 14b. The widths Wa' and Wb' of the grating electrodes 14a and 14b in the edge region 54 are identical.

The duty ratio Da of the comb-shaped electrode 20a in the center region 52 is 2 Wa/λ=80%, and the duty ratio Db of the comb-shaped electrode 20b in the center region 52 is 2 Wb/λ=50%. The duty ratio D is 65%. Accordingly, the resonant frequency is 700.86 MHz, and the acoustic velocity of the acoustic wave is 3083.8 m/s.

The duty ratio Da' of the comb-shaped electrode 20a in the edge region 54 is 2 Wa'/λ=54%, and the duty ratio Db' of the comb-shaped electrode 20b in the edge region 54 is 2 Wb'/λ=54%. The duty ratio D' is 54%. Accordingly, the resonant frequency is 697.05 MHz, and the acoustic velocity of the acoustic wave is 3067.0 m/s.

The acoustic velocity in the edge region 54 of the acoustic wave is less than the acoustic velocity in the center region 52 of the acoustic wave by approximately 0.54%. In the above described manner, the piston mode is achieved.

In the first embodiment, the duty ratio D (the average of Da and Db) in the center region 52 is 65%. Thus, compared to the first comparative example in FIG. 6, the first embodiment reduces the size of the acoustic wave resonator. In addition, the interval between the adjacent grating electrodes 14a and 14b in the first embodiment is equal to that in the first comparative example. Thus, the fabrication is easy in the first embodiment as in the first comparative example.

In the first embodiment, the duty ratio of the grating electrodes 14a and 14b of the pair of comb-shaped electrodes 20a and 20b in the center region 52 differs from the duty ratio of the grating electrodes 14a and 14b of the pair of comb-shaped electrodes 20a and 20b in the edge region 54. For example, in the example in FIG. 9A and FIG. 9B, the duty ratio D in the center region 52 is 65%, and the duty ratio D' in the edge region 54 is 54%.

The width of the grating electrode 14a of the first comb-shaped electrode 20a of the pair of comb-shaped electrodes 20a and 20b in the center region 52 differs from the width of the grating electrode 14b of the second comb-shaped electrode 20b of the pair of comb-shaped electrodes 20a and 20b in the center region 52.

Accordingly, the acoustic velocity of the acoustic wave in the edge region 54 is made to differ from the acoustic velocity of the acoustic wave in the center region 52. Thus, the piston mode is achieved, and the lateral-mode spurious is thereby reduced. In addition, since the duty ratio D in the center region 52 can be made to be large, the electrostatic capacitance of the IDT 21 can be made to be large. Therefore, the size of the acoustic wave resonator is reduced.

To reduce the size of the acoustic wave resonator, the duty ratio D of the pair of comb-shaped electrodes 20a and 20b in the center region 52 longer than the edge region 54 is preferably 60% or greater, more preferably 65% or greater, further preferably 75% or greater. To make the fabrication process easy, the duty ratio D in the center region 52 is preferably 80% or less, more preferably 75% or less, further preferably 70% or less. To reduce the size of the acoustic wave resonator, also in the edge region 54 shorter than the center region 52, the duty ratio D' of the pair of comb-shaped electrodes 20a and 20b is preferably 50% or greater. The duty ratio D' in the edge region 54 is preferably 80% or less, more preferably 75% or less, further preferably 70% or less. The difference between the duty ratios D and D' is preferably 1% or greater, more preferably 5% or greater, further preferably 10% or greater. The difference between the duty ratios Da and Db is preferably 1% or greater, more preferably 5% or greater, further preferably 10% or greater.

The above-described relationship between the grating electrodes 14a and 14b is achieved in at least a part of the region of the IDT 21 in the X direction. The above-described relationship between the grating electrodes 14a and 14b is preferably achieved in the entire region of the IDT 21 in the X direction.

The duty ratio D of the grating electrodes 14a and 14b of the pair of comb-shaped electrodes 20a and 20b in the center region 52 is greater than the duty ratio D' of the grating electrodes 14a and 14b of the pair of comb-shaped electrodes 20a and 20b in the edge region 54. Accordingly, the size of the acoustic wave resonator is reduced.

To achieve the piston mode, the length of the center region 52 in the Y direction and the length of the edge region 54 in the Y direction preferably meet a certain condition. For example, the length of the center region 52 in the Y direction is preferably greater than the total length of the edge regions 54 in the Y direction. The sum of the lengths of the edge regions 54 in the Y direction is preferably 5λ or less (for example, one quarter of the aperture length or less), more preferably 2λ or less (for example, one tenth of the aperture length or less). The width of the edge region 54 in the Y direction is preferably 0.1λ or greater (for example, one two-hundredth of the aperture length or greater), more preferably 0.5λ or greater (for example, one fortieth of the aperture length or greater). The edge region 54 may be located at one side of the center region 52.

The anisotropy coefficient γ in the center region 52 is positive. Accordingly, the piston mode is achieved by making the acoustic velocity of the acoustic wave excited by the grating electrodes 14a and 14b in the edge region 54 lower than the acoustic velocity of the acoustic wave in the center region 52. The acoustic velocity of the acoustic wave in the edge region 54 is lower than the acoustic velocity of the acoustic wave in the center region 52 preferably by 2.5% or greater, more preferably by 1.0% or greater. The anisotropy coefficient γ in the center region 52 may be negative. In this case, the piston mode is achieved by making the acoustic velocity of the acoustic wave in the edge region 54 higher than the acoustic velocity of the acoustic wave in the center region 52.

First Variation of the First Embodiment

Figure 10:
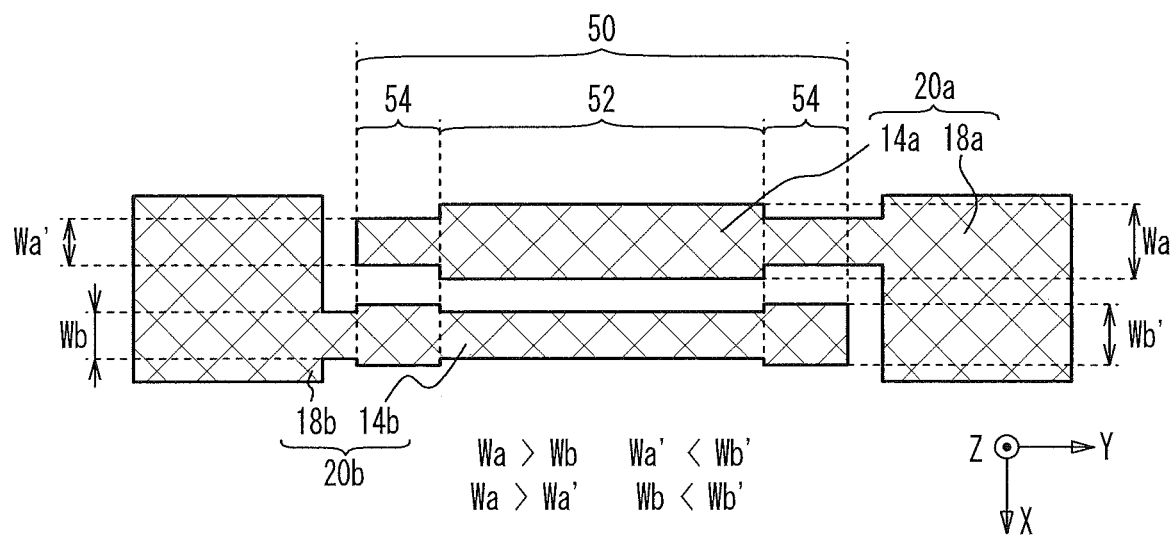
FIG. 10 is a plan view of a pair of grating electrodes of an acoustic wave resonator in accordance with a first variation of the first embodiment.

FIG. 10 is a plan view of a pair of grating electrodes of an acoustic wave resonator in accordance with a first variation of the first embodiment. As illustrated in FIG. 10, the widths Wa' and Wb' of the grating electrodes 14a and 14b in the edge region 54 differ from each other.

As in the first variation of the first embodiment, the width of the grating electrode 14a in the edge region 54 may differ from the width of the grating electrode 14b in the edge region 54.

The grating electrode 14a in the center region 52 is wider than the grating electrode 14b in the center region 52. That is, Wa>Wb. The grating electrode 14a in the edge region 54 is narrower than the grating electrode 14b in the edge region 54. That is, Wa'<Wb'. The grating electrode 14a in the edge region 54 is narrower than the grating electrode 14a in the center region 52. That is, Wa>Wa'. The grating electrode 14b in the edge region 54 is wider than the grating electrode 14b in the center region 52. That is, Wb<Wb'. The first variation of the first embodiment also achieves the piston mode and reduces the size of the acoustic wave resonator.

In the first embodiment and the variation thereof, the above-described relationship between the grating electrodes 14a and 14b is achieved in at least a part of the region of the IDT 21 in the X direction. The above-described relationship between the grating electrodes 14a and 14b is preferably achieved in the entire region of the IDT 21 in the X direction.

Second Embodiment

Figure 11A:
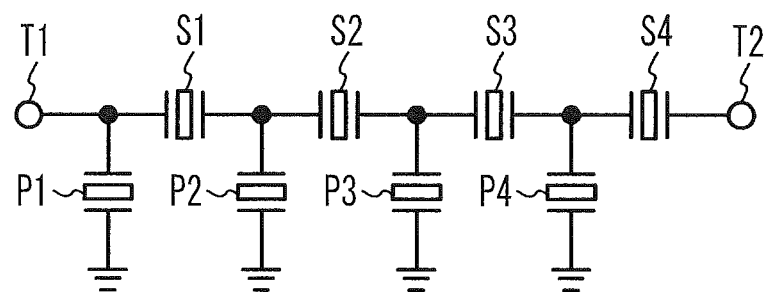
FIG. 11A is a circuit diagram of a filter in accordance with a second embodiment.

FIG. 11A is a circuit diagram of a filter in accordance with a second embodiment. As illustrated in FIG. 11A, one or more series resonators S1 through S4 are connected in series between an input terminal T1 and an output terminal T2. One or more parallel resonators P1 through P4 are connected in parallel between the input terminal T1 and the output terminal T2. The acoustic wave resonator according to any one of the first embodiment and the variation thereof can be used for at least one of the one or more series resonators S1 through S4 and the one or more parallel resonators P1 through P4. The number of resonators in the ladder-type filter can be appropriately set.

First Variation of the Second Embodiment

Figure 11B:
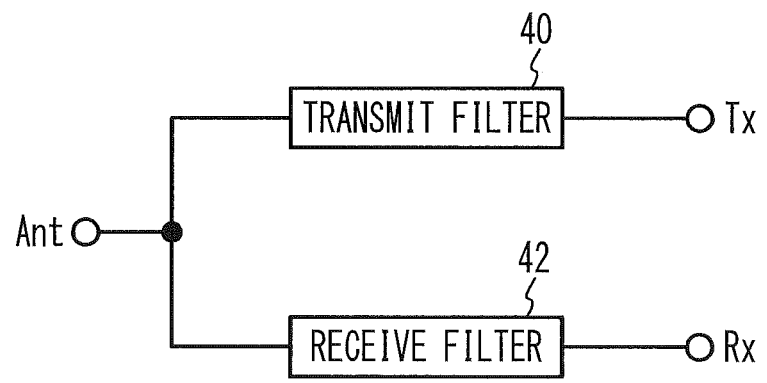
FIG. 11B is a circuit diagram of a duplexer in accordance with a first variation of the second embodiment.

FIG. 11B is a circuit diagram of a duplexer in accordance with a first variation of the second embodiment. As illustrated in FIG. 11B, a transmit filter 40 is connected between a common terminal Ant and a transmit terminal Tx. A receive filter 42 is connected between a common terminal Ant and a receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 and the receive filter 42 can be the filter of the second embodiment.

A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave resonator comprising:
a piezoelectric substrate; and
an IDT that is located on the piezoelectric substrate and includes a pair of comb-shaped electrodes facing each other, each of the pair of comb-shaped electrodes having grating electrodes, which excite an acoustic wave, and a bus bar connected to the grating electrodes, the grating electrodes of a first comb-shaped electrode of the pair of comb-shaped electrodes and the grating electrodes of a second comb-shaped electrode of the pair of comb-shaped electrodes are alternately arranged in at least a part of a region of the IDT in a direction in which the grating electrodes are arranged, a duty ratio of grating electrodes of the pair of comb-shaped electrodes in a center region of an overlap region differing from a duty ratio of grating electrodes of the pair of comb-shaped electrodes in an edge region of the overlap region in the at least the part of the region of the IDT, the grating electrodes of each of the pair of comb-shaped electrodes overlapping with the grating electrodes of the other in the overlap region, a width of grating electrodes of the first comb-shaped electrode of the pair of comb-shaped electrodes in the center region differing from a width of the grating electrodes of the second comb-shaped electrode of the pair of comb-shaped electrodes in the center region in the at least the part of the region of the IDT.

2. The acoustic wave resonator according to claim 1, wherein
the duty ratio of the grating electrodes of the pair of comb-shaped electrodes in the center region is greater than the duty ratio of the grating electrodes of the pair of comb-shaped electrodes in the edge region in the at least the part of the region of the IDT.

3. The acoustic wave resonator according to claim 1, wherein
a width of grating electrodes of the first comb-shaped electrode in the edge region is approximately equal to a width of grating electrodes of the second comb-shaped electrode in the edge region in the at least the part of the region of the IDT.

4. The acoustic wave resonator according to claim 1, wherein
a width of the grating electrodes of the first comb-shaped electrode in the edge region differs from a width of the grating electrodes of the second comb-shaped electrode in the edge region in the at least the part of the region of the IDT.

5. The acoustic wave resonator according to claim 1, wherein
the grating electrodes of the first comb-shaped electrode in the center region is wider than the grating electrodes of the second comb-shaped electrode in the center region in the at least the part of the region of the IDT, grating electrodes of the first comb-shaped electrode in the edge region is narrower than grating electrodes of the second comb-shaped electrode in the edge region in the at least the part of the region of the IDT,
the grating electrodes of the first comb-shaped electrode in the edge region is narrower than the grating electrodes of the first comb-shaped electrode in the center region in the at least the part of the region of the IDT, and
the grating electrodes of the second comb-shaped electrode in the edge region is wider than the grating electrodes of the second comb-shaped electrode in the center region in the at least the part of the region of the IDT.

6. The acoustic wave resonator according to claim 1, wherein
a length of the center region in a direction in which the grating electrodes of each of the pair of comb-shaped electrodes extend is greater than a total length of the edge region in the direction in which the grating electrodes of each of the pair of comb-shaped electrodes extend.

7. The acoustic wave resonator according to claim 1, wherein
an anisotropy coefficient in the center region is positive.

8. The acoustic wave resonator according to claim 7, wherein
an acoustic velocity of an acoustic wave excited by the grating electrodes of the pair of comb-shaped electrodes in the edge region is lower than an acoustic velocity of an acoustic wave excited by the grating electrodes of the pair of comb-shaped electrodes in the center region.

9. A filter comprising:
an acoustic wave resonator according to claim 1.

10. A multiplexer comprising:
a filter including the acoustic wave resonator according to claim 1.

11. An acoustic wave resonator comprising:
a piezoelectric substrate; and
an IDT that is located on the piezoelectric substrate and includes a pair of comb-shaped electrodes facing each other, each of the pair of comb-shaped electrodes having grating electrodes, which excite an acoustic wave, and a bus bar connected to the grating electrodes, a duty ratio of grating electrodes of the pair of comb-shaped electrodes in a center region of an overlap region differing from a duty ratio of grating electrodes of the pair of comb-shaped electrodes in an edge region of the overlap region in at least a part of a region of the IDT in a direction in which the grating electrodes are arranged, the grating electrodes of each of the pair of comb-shaped electrodes overlapping with the grating electrodes of the other in the overlap region, a width of a grating electrode of a first comb-shaped electrode of the pair of comb-shaped electrodes in the center region differing from a width of a grating electrode of a second comb-shaped electrode of the pair of comb-shaped electrodes in the center region,
wherein
the grating electrode of the first comb-shaped electrode in the center region is wider than the grating electrode of the second comb-shaped electrode in the center region,
a grating electrode of the first comb-shaped electrode in the edge region is narrower than a grating electrode of the second comb-shaped electrode in the edge region, the grating electrode of the first comb-shaped electrode in the edge region is narrower than the grating electrode of the first comb-shaped electrode in the center region, and the grating electrode of the second comb-shaped electrode in the edge region is wider than the grating electrode of the second comb-shaped electrode in the center region.

12. An acoustic wave resonator comprising:

a piezoelectric substrate; and an IDT that Is located on the piezoelectric substrate and includes a pair of comb-shaped electrodes facing each other, each of the pair of comb-shaped electrodes having grating electrodes, which excite an acoustic wave, and a bus bar connected to the grating electrodes, a duty ratio of grating electrodes of the pair of comb-shaped electrodes in a center region of an overlap region differing from a duty ratio of grating electrodes of the pair of comb-shaped electrodes in an edge region of the overlap region in at least a part on a region of the IDT in a direction in which the grating electrodes are arranged, the grating electrodes of each of the pair of comb-shaped electrodes overlapping with the grating electrodes of the other in the overlap region, a width of a grating electrode of a first comb-shaped electrode of the pair of comb-shaped electrodes in the center region differing from a width of a grating electrode of a second comb-shaped electrode of the pair of comb-shaped electrodes in the center region, wherein the duty ratio of the grating electrodes of the pair of comb-shaped electrodes in the center region is greater than the duty ratio of the grating electrodes of the pair of comb-shaped electrodes in the edge region.

13. The acoustic wave resonator according to claim 12, wherein a width of a grating electrode of the first comb-shaped electrode in the edge region is approximately equal to a width of a grating electrode of the second comb-shaped electrode in the edge region.

14. The acoustic wave resonator according to claim 12, wherein a width of a grating electrode of the first comb-shaped electrode in the edge region differs from a width of a grating electrode of the second comb-shaped electrode in the edge region.

15. The acoustic wave resonator according to claim 12, wherein a length of the center region in a direction in which the grating electrodes of each of the pair of comb-shaped electrodes extend is greater than a total length of the edge region in the direction in which the grating electrodes of each of the pair of comb-shaped electrodes extend.

16. The acoustic wave resonator according to claim 12, wherein an anisotropy coefficient in the center region is positive.

17. The acoustic wave resonator according to claim 16, wherein an acoustic velocity of an acoustic wave excited by the grating electrodes of the pair of comb-shaped electrodes in the edge region is lower than an acoustic velocity of an acoustic wave excited by the grating electrodes of the pair of comb-shaped electrodes in the center region.

18. A filter comprising:

an acoustic wave resonator according to claim 12.

19. A multiplexer comprising:

a filter including an acoustic wave resonator according to claim 12.

* * * * *